United States Patent [19]

Kanda et al.

[11] Patent Number: 5,123,992
[45] Date of Patent: Jun. 23, 1992

[54] TAPE EDITING SLICER

[75] Inventors: Kunio Kanda, Noda; Shigeo Shioiri, Abiko; Yuzo Otomine, Kawasaki, all of Japan

[73] Assignee: Somar Corporation, Japan

[21] Appl. No.: 521,386

[22] Filed: May 10, 1990

[30] Foreign Application Priority Data

Oct. 19, 1989 [JP] Japan .................. 1-121683[U]

[51] Int. Cl.$^5$ ............................................ B31F 5/06
[52] U.S. Cl. .................................. 156/506; 83/607; 156/159
[58] Field of Search ............. 156/159, 304.3, 502, 156/505, 506, 509; 83/607, 605, 610

[56] References Cited

U.S. PATENT DOCUMENTS

| | | | |
|---|---|---|---|
| 1,191,321 | 7/1916 | Kunert | 156/509 |
| 1,331,563 | 2/1920 | Genter | 83/607 |
| 3,075,572 | 1/1963 | Catozzo | 156/505 |
| 3,169,896 | 2/1965 | Dresser | 83/607 |
| 4,764,243 | 8/1988 | Shioiri et al. | 156/505 |

FOREIGN PATENT DOCUMENTS

| | | |
|---|---|---|
| 0830286 | 5/1981 | U.S.S.R. ........... 156/506 |
| 2060925 | 9/1980 | United Kingdom . |

OTHER PUBLICATIONS

Burder, John, 16mm *Film Cutting*, 1975, pp. 28, 29, 56, 57.
Neumade Products Corporation Brochure, 1977.
Patents Abstracts of Japan, vol. No. 011, No. 291, Sep. 19, 1987, publication No. 62-86592.

*Primary Examiner*—Michael W. Ball
*Assistant Examiner*—Steven D. Maki
*Attorney, Agent, or Firm*—Lorusso & Loud

[57] ABSTRACT

An improved splicer for editing a recording tape having a pair of rows of equally spaced apart sprocket holes along both sides thereof is disclosed which includes a base having a groove adapted to receive the recording tape, a plurality of pins planted on the groove and engageable with the sprocket holes to position the recording tape in the groove in a predetermined location relative to the sprocket holes, a cutter secured to the base for cutting the recording tape placed in the groove, and a splicing member for joining two abutting tapes placed in the groove. The improved cutter which includes a stationary blade fixedly secured to the base; an inner, movable blade pivotally supported by the stationary blade and cooperable therewith to cut the recording tape placed in the groove; and an outer, movable blade pivotally connected to the inner blade and cooperable therewith to cut the recording tape placed in the groove.

2 Claims, 3 Drawing Sheets

TAPE EDITING SLICER

This invention relates generally to a splicer for editing recording tapes such as moving picture films and TAB tapes and, more specifically, to an improvement in a film cutter device of such a splicer for cutting a recording tape having a pair of rows of sprocket holes along both sides thereof.

Tape automated bonding (TAB) which is now increasingly used in IC packaging is a method wherein IC chips and leads are bonded to a TAB tape which is a long film carrier bearing a multiplicity of printed wiring pattern units. Before or after bonding of the IC chips, TAB tapes are subjected to inspection to detect wiring defects or the like defects. Then, edition or cutting is performed to omit defective pattern units from the TAB tape and to rearrange the remaining desired portions. A splicer is generally used for this purpose.

Japanese Published Unexamined patent application (Tokkyo Kokai) No. 62-86592 discloses a splicer including a base having a groove adapted to receive a recording tape with sprocket holes along both sides thereof. The groove is provided with pins engageable with the sprocket holes to fix the tape in position. A cutter is secured to the base for cutting the tape placed in the groove. A bonding device is provided on the base for joining two cut tapes placed in the groove with a bonding tape.

With such a known splicer, since the positions of the cutter and the pins are fixed, a recording tape placed in the groove is always cut at one position relative to the sprocket holes. For example, with a splicer which is designed, as shown in FIG. 4(A), to cut a TAB tape T along a line C, it is not possible to cut another tape T' along a line C' as shown in FIG. 4(B). In FIGS. 4(A) and 4(B), the letters A, B and P designate a film carrier, sprocket holes and wiring patterns, respectively, of the TAB tape. Thus, while there are used both kinds of the TAB tapes T and T', the conventional splicer is not satisfactorily adapted for editing both of them at the same time.

SUMMARY OF THE INVENTION

The present invention has been made with the foregoing problem of the prior art in view and provides an improved splicer for editing a recording tape having a pair of rows of equally spaced apart sprocket holes along both sides thereof, which comprises a base having a groove adapted to receive the recording tape, the groove being provided with pins engageable with the sprocket holes to position the recording tape in the groove in a predetermined location relative to the sprocket holes, a cutter secured to the base for cutting the recording tape placed in the groove, and means for joining two abutted tapes placed in the groove. The cutter includes:

a stationary blade fixedly secured to the base;

an inner, movable blade having one pivotally connected to the stationary blade and cooperable wherewith to cut the recording tape placed in the groove; and an outer, movable blade pivotally connected to the opposite end of the inner blade and cooperable therewith to cut the recording tape placed in the groove.

BRIEF DESCRIPTION OF THE DRAWINGS

The present invention will now be described in detail below with reference to the accompanying drawings, in which.

DESCRIPTION OF THE PREFERRED EMBODIMENTS

Figure 1:
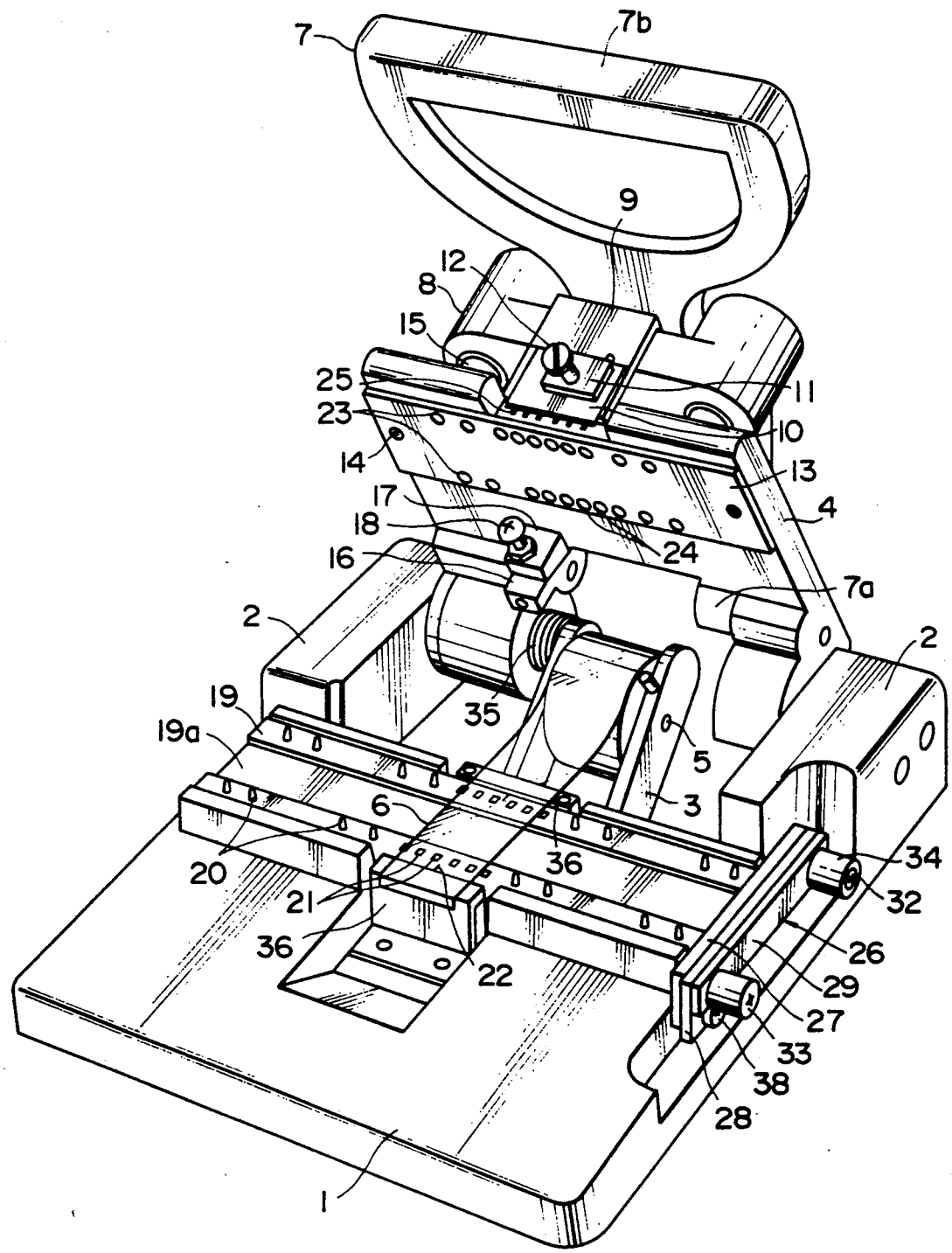
FIG. 1 is a perspective view diagrammatically showing a splicer according to the present invention.

Referring now to FIG. 1, the reference numeral 1 denotes a base body having a laterally extending groove 19 for receiving a recording tape to be processed (not shown). The groove 19 has a shallow, depressed portion 19a so that the tape to be processed can be received in the groove 19 in a flat state, even when it has protrusions, such as IC chips, on its surface. Planted on both sides of the groove 19 are a plurality of pins 20 engageable with sprocket holes B (FIGS. 4(a) and 4(b)) of the tape to fix the tape in position. Also formed at both sides of a center portion of the groove 19 are die holes 21 arranged to coincide with the sprocket holes of a recording tape placed in the groove 19.

Extending rearwardly and upwardly from a rear end portion of the base body 1 are a pair of arms 3 between which a shaft 5 is supported. A roll of an adhesive tape 6 is rotatably supported about the shaft 5. A pair of tape support plates 36 are provided adjacent to the die holes 21. The splicer of the present invention is so constructed as to join two abutted tapes, placed in the groove 19 with their abutting portion being positioned between the die holes 21 (e.g. in alignment with a reference line 22), with the adhesive tape 6 which has been manually pulled from the roll and positioned just above the abutting portions as shown in FIG. 1. The splicer is operated to cut the adhesive tape 6 to the same length as the width of the tapes to be joined, to press the cut adhesive tape 6 against the two tapes to be joined for bonding and to form perforations in the adhesive tape 6 at positions corresponding to the die holes 21.

The base body 1 has a pair of rearwardly extending portions 2 between which an arm member 4 is rotatably supported. The arm member 4 is normally urged to pivot apart from the base body 1 by the action of a coil spring 35, the pivoting rotation being limited by a stopper not shown. A flat, pressing plate 13 is fixed by screws 14 to the underside surface of the arm member 4. The plate 13 is provided with throughholes 23 engageable with the pins 20 on the groove 19 and throughholes 24 arranged to coincide with the die holes 21 of the groove 19.

The arm member 4 rotatably supports a handle 7 at one end portion 7a thereof. The other end of the handle 7 is designed to form a ring 7b suited for being gripped by an operator. The are member 4 has a protrusion 17 having an inner threaded opening into which an adjusting screw 18 is threaded. The handle 7, too, has a protruding portion 16 engageable with the end of the adjusting screw 18 so that the pivoting rotational movement of the handle 7 in a direction away from the arm member 4 is limited by the screw 18. The maximum angular attitude of the handle 7 relative to the arm member 4 may be controlled by rotation of the screw 8.

A cutter holder 8 having a pair of bores within which a pair of pressing bars 15 are slidably received is fixedly secured to the handle 7. Each of the pressing bars 15 has an end portion engageable with an upper surface of the arm member 4 and is normally biased to protrude from the bore by means of a spring (not shown), so that the handle 7 is normally urged to pivot in a direction away from the arm member 4 and, accordingly, the protruding portion 16 of the handle 7 is normally maintained in pressure contact with the screw 18 of the protrusion 17 of the arm member.

The cutter holder 8 has a cutter support 9 to which a pair of spaced apart cutter blades 10 are detachably supported with pressing plates 11 and screws 12. To the cutter holder 8 are also secured a plurality of punches 25 adjacent to the cutter blades 10. The cutter blades 10 and the punches 25 are normally retracted from the underside surface of the plate 13 of the arm member 4. The punches 25 are so arranged as to be able to protrude from through-holes 24 of the press plate 13.

As a result of the above construction, when an operator draws the handle 7 toward the operator's side, the arm member 4 receives a pressing force through the bars 15 and is rotated against the action of the spring 35. Then the plate 13 of the arm member is brought into contact with the groove 19 with the pins 20 being inserted into the through-holes 23. Upon further downward movement of the handle 7, the handle 7 is rotated against the biasing force of the springs disposed within the holder 8, so that the cutter blades 10 are extended from the plate 13. The punches also protrude from the through-holes 24 and engage with the die holes 21. By previously setting two tapes in the groove 19 with their ends being abutted to each other and the adhesive tape 6 on the support plates 36, the two tapes may be joined with the tape 6 by the above operation with the simultaneous formation of punched perforations in the adhesive tape.

On one side of the base body 1 there is provided a cutter designated generally as 26. The cutter 26 includes a stationary blade 27 fixedly secured to the base body 1 by screws 30, an inner, movable blade 28 pivotally supported by the stationary blade 27, and an outer, movable blade 29 pivotally connected to the inner blade 28. In the specific embodiment shown, the outer blade 29 is pivotally connected to the inner blade 28 at a position, opposite the pivotal connection between the inner blade 28 and the stationary blade 27 and the inner blade 28 has a thickness equal to the half of the distance between two adjacent sprocket holes. The stationary blade 27 is positioned such that the top surface thereof lies on the same plane as the groove 19.

Figure 2:
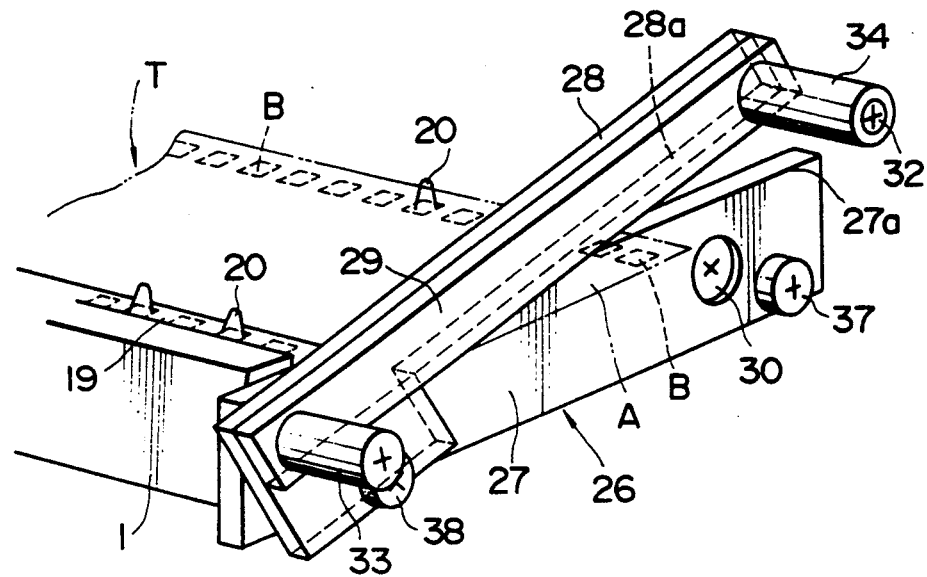
FIG. 2 is an enlarged, fragmentary, perspective view diagrammatically showing one operational state of a cutter of the splicer of FIG. 1.
Figure 4A:
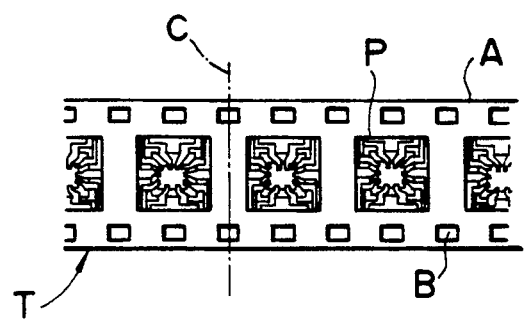
FIGS. 4(a) and 4(b) are partial plan views schematically showing TAB tapes.

As shown in FIG. 2, the inner blade 28 cooperates with the stationary blade 27 to cut a tape T placed in the groove 19 with the pins 20 being inserted into the sprocket holes B of the tape T. The tape T is cut by cooperation of a cutting edge 27a of the stationary blade 27 with a cutting edge 28a of the inner blade 28 along a line C as shown in FIG. 4(a), i.e. along a line extending through the centers of opposite sprocket holes. The resulting cut tape is then spliced with another, similarly cut tape in a manner as described above.

Figure 3:
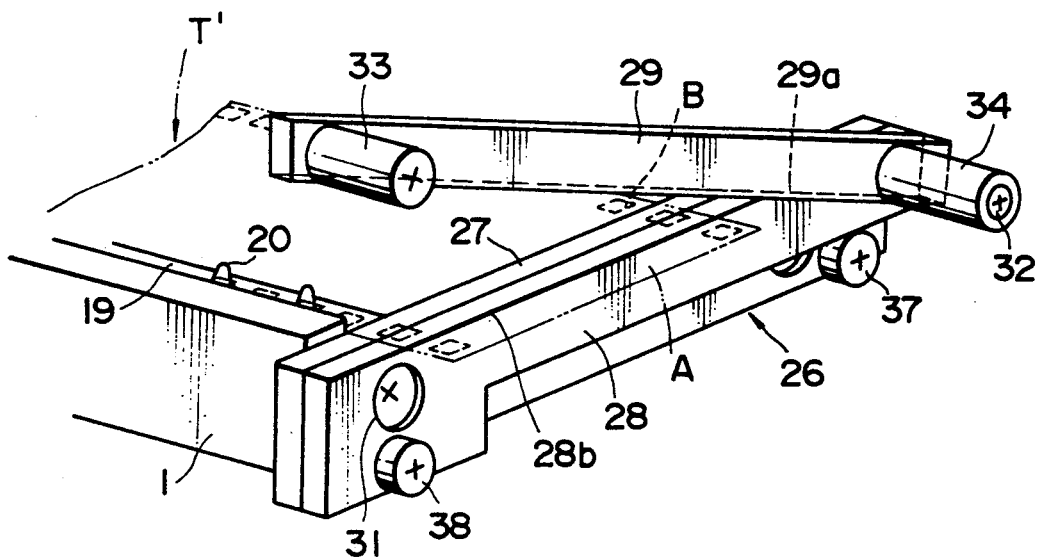
FIG. 3 is a view similar to FIG. 2 showing another operational state of the cutter of FIG. 2.
Figure 4B:
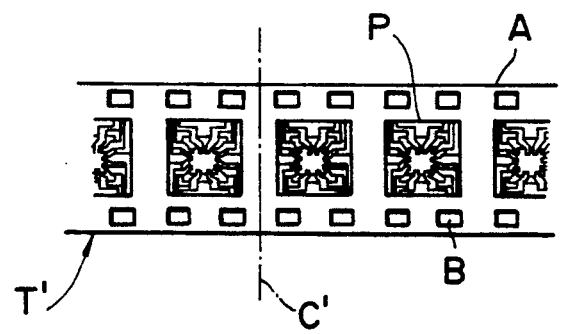

When a tape to be processed is of a type shown in FIG. 4(b), the tape T' cannot be cut along a line extending through the centers of opposite sprocket holes. Rather, the tape T' is desired to be cut along a line C', i.e. along a center line between adjacent two sprocket holes. In such a case, as shown in FIG. 3, the inner blade 28 is rested on a support 37 and the tape is cut by cooperation of a cutting edge 28b of the inner blade 28 with a cutting edge 29a of the outer blade 29. The resulting cut tape is then spliced with another similarly cut tape in the same manner as above.

In FIGS. 2 and 3, the reference numerals 31 and 32 designates pivots, 33 and 34 designate knobs and 38 designate a stopper for resting the outer blade 29. The support 37 for resting the inner blade 28 is positioned so that the upper surface of the inner blade 28 supported thereon can lie on the same plane as that of the stationary blade 27 as shown in FIG. 3.

The invention may be embodied in other specific forms than the above embodiment. For example, the inner and outer blades may be pivoted on the same shaft. The thickness of the inner blade 28 may be $(n+\frac{1}{2})$ times the distance between the two adjacent sprocket holes (where n is an integer), when the recording tapes to be processed are of the two types as shown in FIGS. 4(a) and 4(b). The blades 27, 28 and 29 may be formed of any suitable material such as stainless steel or the like hard metal alloy or a ceramic material.

The splicer according to the present invention is suitably used for editing any information recording tape such as moving picture films and TAB tapes.

What is claimed is:

1. A splicer for editing a recording tape having a pair of rows of equally spaced apart sprocket holes along both sides thereof, said splicer comprising:
   a base having a groove adapted to receive the recording tape, said groove being provided with pins engageable with the sprocket holes to position the recording tape in said groove in a predetermined location relative to the sprocket holes,
   a cutter secured to said base for cutting the recording tape placed in said groove,
   means for joining two abutted tapes placed in said groove,
   said cutter including:
      a stationary blade fixedly secured to said base;
      an inner, movable blade having one end pivotally connected to said stationary blade for cooperation therewith to cut the recording tape placed in said groove; and
      an outer, movable blade pivotally connected to said inner blade at the end of said inner blade opposite said one end, for cooperation with said inner blade to cut the recording tape placed in said groove.

2. The improvement according to claim 1, wherein said inner blade has a thickness equal to the half of the distance between two adjacent sprocket holes.

* * * * *